US008515380B2

(12) United States Patent
Rentala et al.

(10) Patent No.: US 8,515,380 B2
(45) Date of Patent: Aug. 20, 2013

(54) CURRENT MODE BLIXER WITH NOISE CANCELLATION

(75) Inventors: Vijay B. Rentala, Plano, TX (US); Venkatesh Srinivasan, Dallas, TX (US); Srinath M. Ramaswamy, Murphy, TX (US); Baher S. Haroun, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 134 days.

(21) Appl. No.: 13/161,718

(22) Filed: Jun. 16, 2011

(65) Prior Publication Data

US 2012/0322400 A1 Dec. 20, 2012

(51) Int. Cl.
*H04B 1/26* (2006.01)
*H03D 7/00* (2006.01)
*H03D 7/14* (2006.01)

(52) U.S. Cl.
CPC .............. *H03D 7/00* (2013.01); *H03D 7/1441* (2013.01)
USPC ............ 455/313; 455/323; 455/326; 455/333

(58) Field of Classification Search
USPC ........................... 455/313, 319, 323, 326, 333
See application file for complete search history.

(56) References Cited

U.S. PATENT DOCUMENTS

| 6,242,963 | B1 | 6/2001 | Su et al. | |
|---|---|---|---|---|
| 7,299,025 | B1* | 11/2007 | Wong et al. | 455/275 |
| 7,769,361 | B2* | 8/2010 | Zhuo et al. | 455/324 |
| 7,899,426 | B2* | 3/2011 | Tasic et al. | 455/286 |
| 7,902,923 | B2 | 3/2011 | Li et al. | |
| 7,982,527 | B2* | 7/2011 | Dawe et al. | 327/355 |
| 2005/0164671 | A1* | 7/2005 | Darabi | 455/333 |
| 2005/0179494 | A1 | 8/2005 | Banba | |
| 2006/0220714 | A1* | 10/2006 | Hur | 327/175 |
| 2009/0088124 | A1* | 4/2009 | Schuur et al. | 455/341 |
| 2009/0197552 | A1* | 8/2009 | Kurahashi et al. | 455/196.1 |
| 2010/0048152 | A1* | 2/2010 | Villain et al. | 455/130 |

FOREIGN PATENT DOCUMENTS

JP 2007-013560 1/2007

OTHER PUBLICATIONS

"The Blixer, a Wideband Balun-LNA-I/Q-Mixer Topology," IEEE Journal of Solid-State Circuits, vol. 43, No. 12, Dec. 2008, pp. 2706-2715 (Blaakmeer, et al.).
PCT Search Report mailed Jan. 31, 2013.

* cited by examiner

*Primary Examiner* — Duc M Nguyen
(74) *Attorney, Agent, or Firm* — Alan A. R. Cooper; Wade J. Brady, III; Frederick J. Telecky, Jr.

(57) ABSTRACT

Blixers, which are a relatively recent development, have not be studied as extensively as many older circuit designs. Here, a blixer is provided that improves linearity and reduces noise over other conventional blixer designs. To accomplish this, the blixer provided here uses a differential amplifier and/or a dummy path within its mixing circuit to perform noise reduction (and improve linearity).

17 Claims, 4 Drawing Sheets

CURRENT MODE BLIXER WITH NOISE CANCELLATION

TECHNICAL FIELD

The invention relates generally to radio frequency (RF) circuitry and, more particularly, to a blixer.

BACKGROUND

Turning to FIG. 1 of the drawings, an example of a conventional blixer 100 can be seen. A blixer (i.e., 100) is circuit that combines a balun, low-noise amplifier (LNA) and an I/Q mixer. As shown, blixer 100 generally comprises a balun-LNA core (which generally comprises NMOS transistors Q1 and Q2, inductor L, capacitor C1, and resistor R1) coupled to a switching quad or switching core (which generally comprises NMOS transistors Q3 through Q6 and resistor-capacitor (RC) networks 102-1 and 102-2). In operation, an RF input signal is provided to the balun-LNA core (which also receives bias voltages VBIAS1 and VBIAS2). Since transistors Q2 is n-times the size of transistor Q1, the transconductance $g_{m2}$ of transistor Q2 is n-times the transconductance $g_{m1}$ of transistor Q1 (or $g_{m2}=n*g_{m1}$). The signals from balun-LNA core (which are $g_{m1}*V_{IN}$ and $g_{m2}*V_{IN}$) are applied to low impedance nodes of the switching core so as to be mixed with a differential local oscillator signal LOP and LOM. In order to achieve the desired intermediate frequency signals IFP and IFM, transistors Q4 and Q5 are n-times the side of transistors Q3 and Q6. Additionally, each RC network 104-1 through 104-4 has an impedance $Z_2$ that is 1-nth the impedance $Z_1$ of each of RC networks 102-1 and 102-2 (or $Z_2=Z_1/n$). This blixer 100, however, can be noisy, and due to the stacking of the transistors Q1-Q6, the amount of head room available for signal swing can be severely limited, limiting achievable gain. Additionally, this headroom limitation due to the supply voltage also limits the linearity blixer 100. Thus, there is however a desire to improve the linearity and reduce the noise of this blixer 100.

An example of a conventional blixer is Blaakmeer et al., "The BLIXER, a wideband balun-LNA-I/Q-mixer topology," *IEEE J. Solid-State Circuits*, vol. 43, no. 12, pp. 2706-2715, December 2008.

SUMMARY

A preferred embodiment of the present invention, accordingly, provides an apparatus. The apparatus comprises a transconductance circuit that receives an input signal and that generates a first amplified signal and a second amplified signal; and a mixing circuit having: a first mixer that is coupled to the transconductance circuit so as to receive the first amplified signal, wherein the first mixer mixes the first amplified signal with a mixing signal, wherein the mixing signal has a duty cycle that is a fraction of a local oscillator duty cycle; a second mixer that is coupled to the transconductance circuit so as to receive the second amplified signal, wherein the second mixer mixes the second amplified signal with the mixing signal; an first impedance network that is coupled each of the first and second mixers, wherein the first impedance network is adapted to have an feedback impedance; a second impedance network that is coupled each of the first and second mixers, wherein the second impedance network is adapted to have the feedback impedance; and a differential amplifier that is coupled to each impedance network.

In accordance with a preferred embodiment of the present invention, the mixing circuit further comprises a first capacitor that is coupled between the transconductance circuit and the first mixer; and a second capacitor that is coupled between the transconductance circuit and the second mixer.

In accordance with a preferred embodiment of the present invention, the first impedance network further comprises: a first resistor that is coupled to the first mixer; a second resistor that is coupled in series with the first resistor, wherein a collective impedance of the first and second resistors is approximately equal to the feedback impedance, and wherein the second mixer is coupled to a node between the first and second resistors; and a first switch that is coupled in parallel to the first resistor.

In accordance with a preferred embodiment of the present invention, the first impedance network further comprises: a third resistor that is coupled to the first mixer; a fourth resistor that is coupled in series with the third resistor, wherein a collective impedance of the third and fourth resistors is approximately equal to the feedback impedance, and wherein the second mixer is coupled to a node between the first and second resistors; and a second switch that is coupled in parallel to the first resistor.

In accordance with a preferred embodiment of the present invention, the first impedance network further comprises a first resistor having the feedback impedance and wherein the second impedance network further comprises a second resistor having the feedback impedance.

In accordance with a preferred embodiment of the present invention, the mixing circuit further comprises a dummy path that is coupled to second capacitor.

In accordance with a preferred embodiment of the present invention, the differential amplifier further comprises a first differential amplifier, and wherein the dummy path further comprises: a third mixer that is coupled to the second capacitor; and a second differential amplifier that is coupled to the third mixer.

In accordance with a preferred embodiment of the present invention, the fraction further comprises a first fraction, and wherein the mixing signal further comprises a first mixing signal, and wherein the third mixer mixes the second amplified signal with a second mixing signal having a duty cycle that is a second fraction of the local oscillator duty cycle.

In accordance with a preferred embodiment of the present invention, the transistors from each of first and second mixers have a first size, and wherein the transistors from the third mixer have a second size.

In accordance with a preferred embodiment of the present invention, an apparatus comprising: a transconductance circuit that generates a first amplified signal and a second amplified signal, wherein the transconductance circuit includes: a first current source having a first current; a second current source having a second current, wherein the second current is K-times larger than the first current; a first transistor that is coupled to the first current source and that receives a first bias voltage; a second transistor that is coupled to the first transistor and that receives an input signal and a second bias voltage; a third transistor that is coupled to the second current source and that receives first bias voltage; and a fourth transistor that is coupled to the third transistor and that receives the input signal and the second bias voltage; and a mixing circuit having: a first mixer that is coupled to the transconductance circuit so as to receive the first amplified signal, wherein the first mixer mixes the first amplified signal with a mixing signal, wherein the mixing signal has a duty cycle that is a fraction of a local oscillator duty cycle; a second mixer that is coupled to the transconductance circuit so as to receive the second amplified signal, wherein the second mixer mixes the second amplified signal with the mixing signal; an first impedance network that is coupled each of the first and second mixers, wherein the first impedance network is adapted to have an feedback impedance; a second impedance network that is coupled each of the first and second mixers, wherein the second impedance network is adapted to have the feedback impedance; and a differential amplifier that is coupled to each impedance network.

In accordance with a preferred embodiment of the present invention, the transconductance circuit further comprises: a resistor that is coupled to the fourth transistor and that receives the second bias voltage; and a capacitor that is coupled to the fourth transistor and that receives the input signal.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
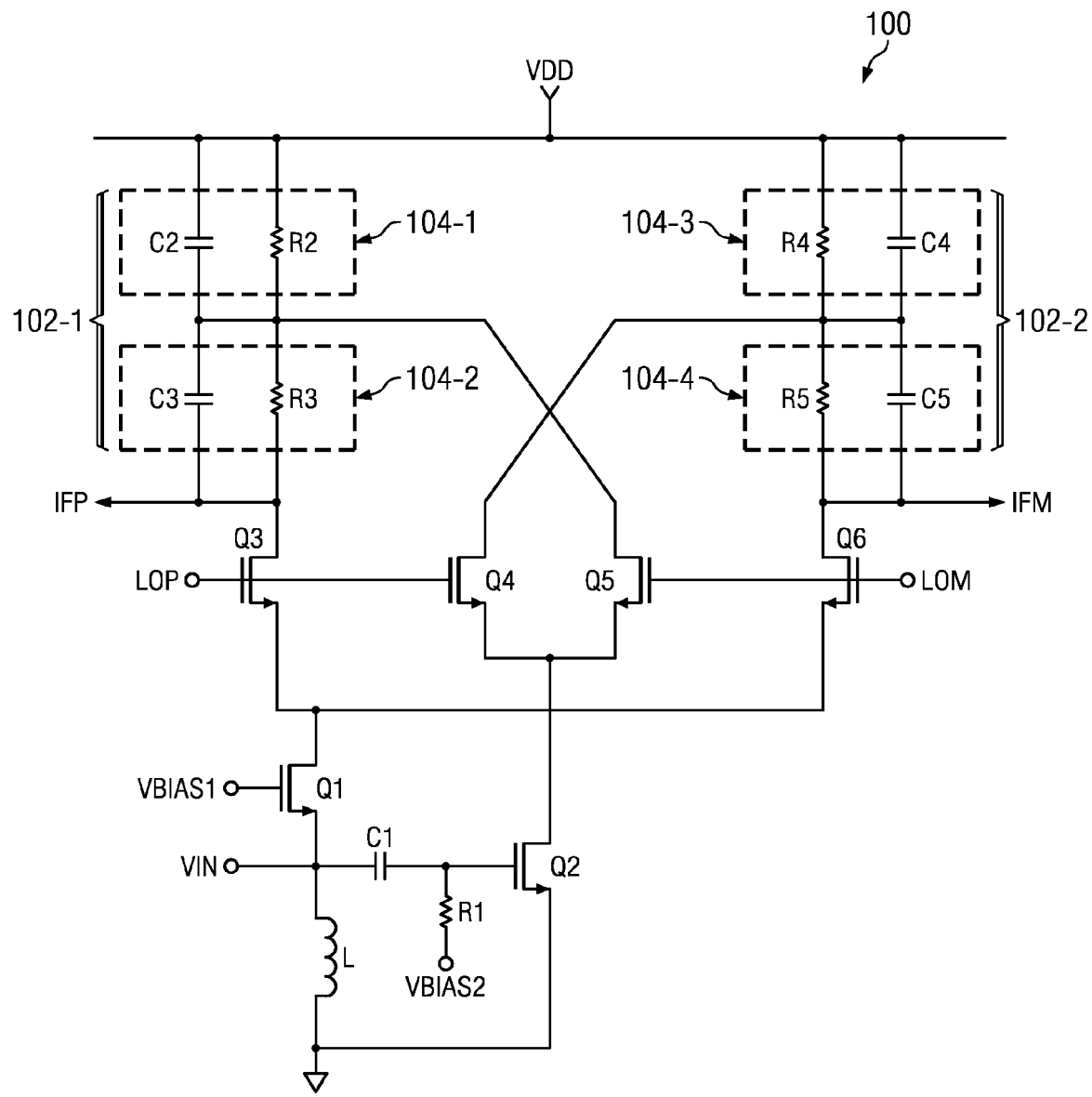
FIG. 1 is a circuit diagram of a conventional blixer.

Refer now to the drawings wherein depicted elements are, for the sake of clarity, not necessarily shown to scale and wherein like or similar elements are designated by the same reference numeral through the several views.

Figure 2:
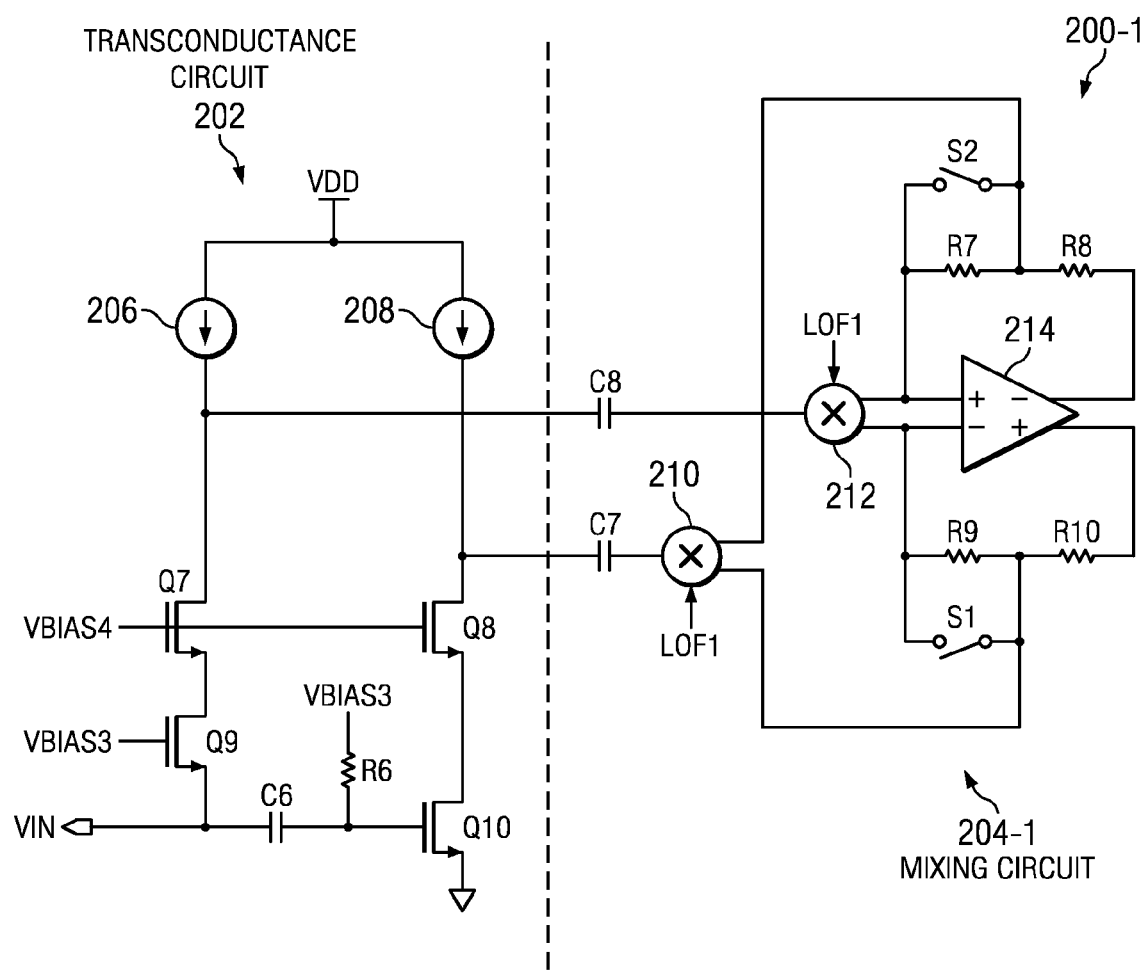
FIGS. 2 through 4 are circuit diagrams of examples of blixers in accordance with a preferred embodiment of the present invention.

Turning to FIG. 2, an example of a blixer 200-1 in accordance with a preferred embodiment of the present invention can be seen. Blixer 200-1 generally comprises a transconductance circuit 202 and a mixing circuit 204-1. In operation, the tranconductance circuit 202 generally receives the input signal VIN and generates amplified signals from the input signal VIN. Mixing circuit 204-1 then can mix these amplified signals with a mixing signal LOF1 having a duty cycle that is a fraction (generally 50% or 25%) of a local oscillator signal so that differential amplifier 214 and impedance networks (generally resistors R7 and R8 and switch S2 or resistors R9 and R10 and switch S1) can generally perform noise cancellation or noise reduction. The mixing is generally performed by mixers 210 and 212, which are typically passive mixers (which can, for example, be Gilbert cell mixers).

To generate the amplified signal, the transconductance circuit 202 generally uses two branches that each generate one of the amplified signals. The input signal VIN is generally received at the source of NMOS transistor Q9 (which can biased by bias voltage VBIAS3 and generally has a transconductance $g_{m3}$), and, in combination with current source 206 (which can generate a current I0) and NMOS transistor Q7 (which can bias by bias voltage VBIAS4), transistor Q9 generates an amplified signal (which is generally VIN*$g_{m3}$). Additionally, NMOS transistor Q10 generally receives the input voltage VIN through capacitor C6 (which is also biased by bias voltage VBIAS3 through resistor R6). This transistor Q10 generally has a transconductance of K*$g_{m3}$ and, in combination with transistor Q8 (which is generally biased by bias voltage VBIAS4) and current source 208 (which generates a current of K*I0), generates an amplified signal (which is generally VIN*K*$g_{m3}$). These amplified signals can then be provided to AC-coupling capacitors C7 and C8.

To provide noise cancellation, switches S1 and S2 can be actuated to vary the impedance of the impedance networks. Typically, resistor R8 and R10 have resistances of K*RL, and resistors R7 and R9 typically have resistances of (K−1)RL/K. When the switches S1 and S2 are actuated, the total resistance (or impedance for the circuit shown) for each impedance network is RL. Thus, when switches S1 and S2 are actuated, the differential amplifier 214 is used to perform noise reduction using the total impedance of the impedance network, whereas in normal operation (when switches S1 and S2 are open), a resistance of K*RL is used.

Figure 3:
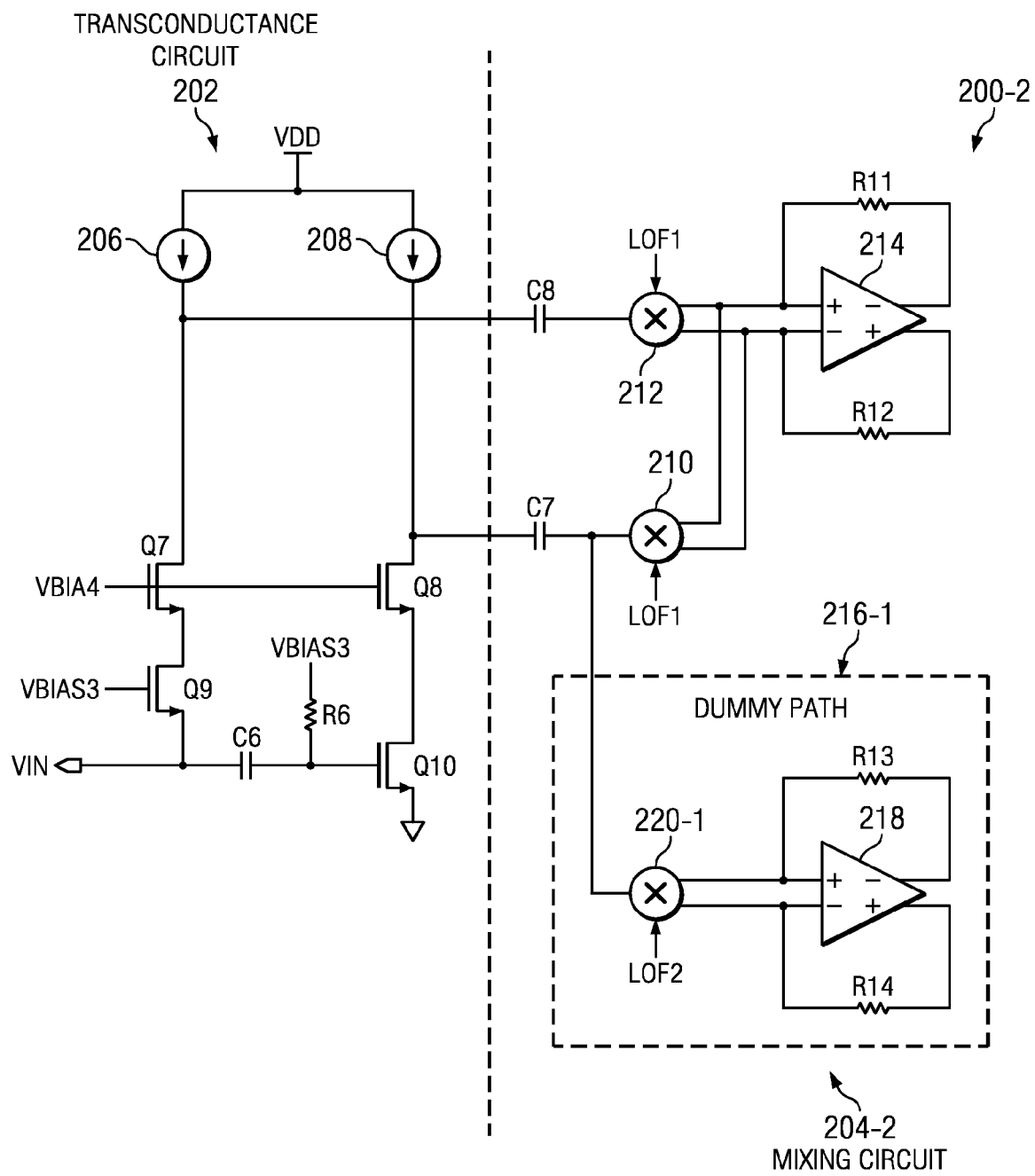

Turning to FIG. 3, another example of a blixer 200-2 can be seen. In this configuration the impedance networks of blixer 200-1 have been replaced by resistors R11 and R12 (which generally have a resistance of RL) and a dummy path 216-1 has been included. The dummy path 216-1 generally comprises a mixer 220-1 (which is typically a passive mixer having transistors that are about the same size or aspect ratio (channel width to channel length) as the transistors used for mixers 210 and 220), differential amplifier 218, and resistors R13 and R14 (which each typically have a resistance of RL). Typically, mixer 220-1 mixes an amplified output signal from capacitor C7 with a mixing signal LOF2 having a duty cycle that is a fraction or multiple (i.e., K−2 times) the local oscillator duty cycle. This dummy path 216-1 generally "siphons" the extra signal current from the main path. Additionally, the dummy path 216-1 can be used for RF filtering by appropriately sizing the filter around amplifier 218.

Figure 4:
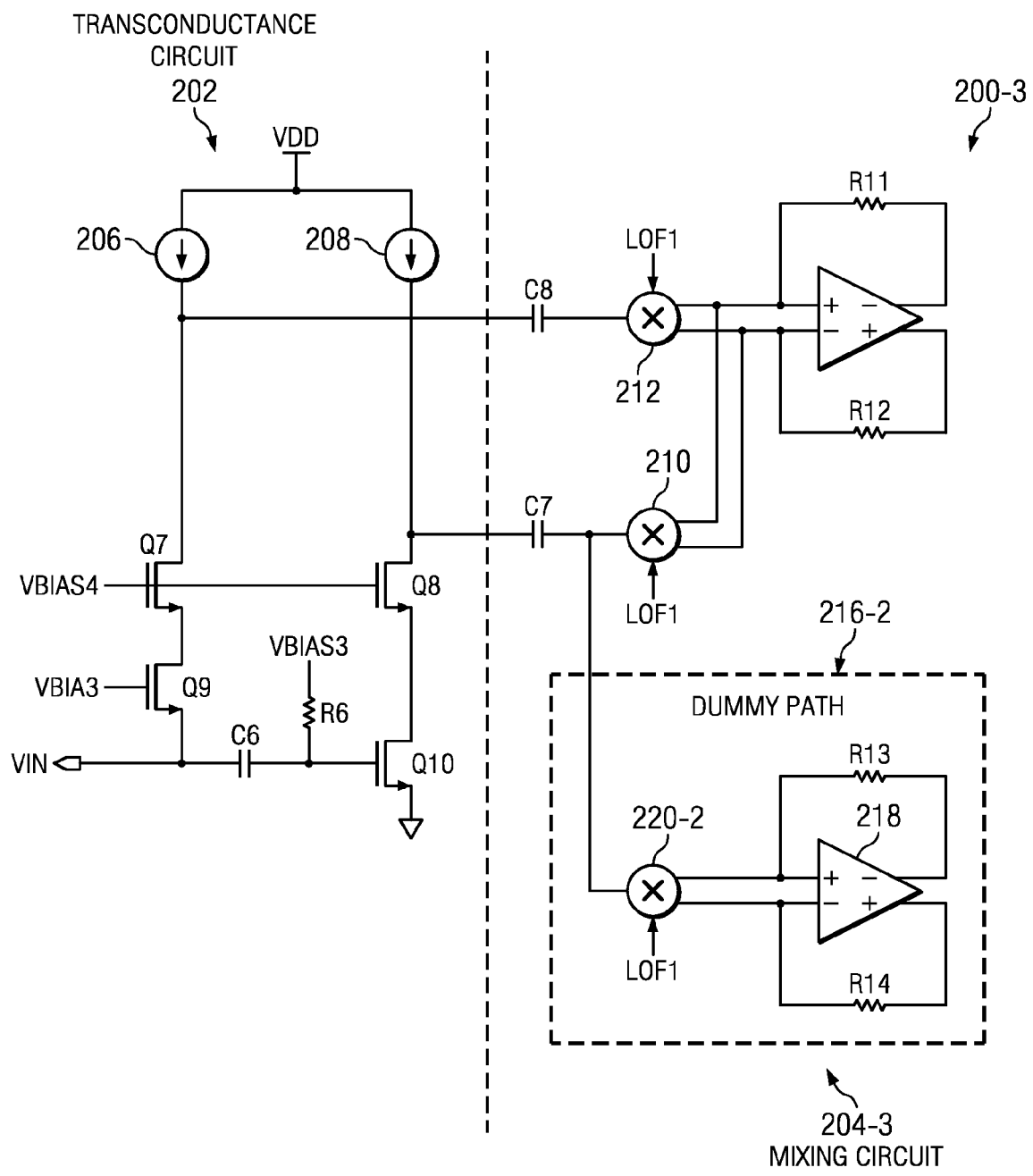

In another alternative, which can be seen in FIG. 4, blixer 200-3 generally uses a dummy path 216-2 instead of dummy path 216-1. A difference between dummy paths 216-1 and 216-2 lies in difference between mixers 220-1 and 220-2. Namely, mixer 220-2 uses mixing signal LOF1, but the transistors used within mixer 220-2 are K−1 times the size of the transistors used for mixers 210 and 212. This arrangement for blixer 200-3 generally provides substantially similar functionality to the arrangement for blixer 200-2 but may provide an advantageous layout.

As a result of using the blixer 200-1, 200-2, or 200-3, several advantages can be realized. Namely, the linearity is improved over blixer 100 due to the low signal swing at the output of transconductance circuit 202. There is also a much larger intermediate frequency gain due to the available signal swing. Additionally, there is generally little to no flicker noise because of the passive nature of the mixing circuits 204-1, 204-2, and 204-3. To demonstrate the improved performance, Table 1 is provided below, which compares blixer 100 to blixer 200-1, 200-2, and 200-3.

TABLE 1

|  | Blixer 100 | Blixer 200-1, 200-2, or 200-3 |
| --- | --- | --- |
| Noise | 4.3 dB | 2.1 dB |
| IP$_3$ | +10 dBm | +14.5 dBm |
| Signal swing after mixer | +15 dB (voltage output) | +5 dB (current output) |
| DC current | 3 + 12 + 16 mA | 2 + 8 mA |

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a transconductance circuit that receives an input signal and that generates a first amplified signal and a second amplified signal; and
   a mixing circuit having:
      a first mixer that is coupled to the transconductance circuit so as to receive the first amplified signal, wherein the first mixer mixes the first amplified signal with a mixing signal, wherein the mixing signal has a duty cycle that is a fraction of a local oscillator duty cycle;
      a second mixer that is coupled to the transconductance circuit so as to receive the second amplified signal, wherein the second mixer mixes the second amplified signal with the mixing signal;
      an first impedance network that is coupled each of the first and second mixers, wherein the first impedance network is adapted to have an feedback impedance;
      a second impedance network that is coupled each of the first and second mixers, wherein the second impedance network is adapted to have the feedback impedance; and
      a differential amplifier that is coupled to each impedance network, wherein the mixing circuit further comprises:
      a first capacitor that is coupled between the transconductance circuit and the first mixer; and
      a second capacitor that is coupled between the transconductance circuit and the second mixer,
   wherein the first impedance network further comprises:
   a first resistor that is coupled to the first mixer;
   a second resistor that is coupled in series with the first resistor, wherein a collective impedance of the first and second resistors is approximately equal to the feedback impedance, and wherein the second mixer is coupled to a node between the first and second resistors; and
   a first switch that is coupled in parallel to the first resistor.

2. The apparatus of claim 1, wherein the first impedance network further comprises:
   a third resistor that is coupled to the first mixer;
   a fourth resistor that is coupled in series with the third resistor, wherein a collective impedance of the third and fourth resistors is approximately equal to the feedback impedance, and wherein the second mixer is coupled to a node between the first and second resistors; and
   a second switch that is coupled in parallel to the first resistor.

3. The apparatus of claim 1, wherein the first impedance network further comprises a first resistor having the feedback impedance and wherein the second impedance network further comprises a second resistor having the feedback impedance.

4. The apparatus of claim 3, wherein the mixing circuit further comprises a dummy path that is coupled to the second capacitor.

5. The apparatus of claim 3, wherein the differential amplifier further comprises a first differential amplifier, and wherein the dummy path further comprises:
   a third mixer that is coupled to the second capacitor; and
   a second differential amplifier that is coupled to the third mixer.

6. The apparatus of claim 5, wherein the fraction further comprises a first fraction, and wherein the mixing signal further comprises a first mixing signal, and wherein the third mixer mixes the second amplified signal with a second mixing signal having a duty cycle that is a second fraction of the local oscillator duty cycle.

7. The apparatus of claim 5, wherein the transistors from each of first and second mixers have a first size, and wherein the transistors from the third mixer have a second size.

8. An apparatus comprising:
   a transconductance circuit that generates a first amplified signal and a second amplified signal, wherein the transconductance circuit includes:
      a first current source having a first current;
      a second current source having a second current, wherein the second current is K-times larger than the first current;
      a first transistor that is coupled to the first current source and that receives a first bias voltage;
      a second transistor that is coupled to the first transistor and that receives an input signal and a second bias voltage;
      a third transistor that is coupled to the second current source and that receives first bias voltage; and
      a fourth transistor that is coupled to the third transistor and that receives the input signal and the second bias voltage; and
   a mixing circuit having:
      a first mixer that is coupled to the transconductance circuit so as to receive the first amplified signal, wherein the first mixer mixes the first amplified signal with a mixing signal, wherein the mixing signal has a duty cycle that is a fraction of a local oscillator duty cycle;
      a second mixer that is coupled to the transconductance circuit so as to receive the second amplified signal, wherein the second mixer mixes the second amplified signal with the mixing signal;
      an first impedance network that is coupled each of the first and second mixers, wherein the first impedance network is adapted to have an feedback impedance;
      a second impedance network that is coupled each of the first and second mixers, wherein the second impedance network is adapted to have the feedback impedance; and
      a differential amplifier that is coupled to each impedance network.

9. The apparatus of claim 8, wherein the transconductance circuit further comprises:
   a resistor that is coupled to the fourth transistor and that receives the second bias voltage; and
   a capacitor that is coupled to the fourth transistor and that receives the input signal.

10. The apparatus of claim 8, wherein the mixing circuit further comprises:
    a first capacitor that is coupled between the transconductance circuit and the first mixer; and
    a second capacitor that is coupled between the transconductance circuit and the second mixer.

11. The apparatus of claim 10, wherein the first impedance network further comprises:
    a first resistor that is coupled to the first mixer;
    a second resistor that is coupled in series with the first resistor, wherein a collective impedance of the first and second resistors is approximately equal to the feedback impedance, and wherein the second mixer is coupled to a node between the first and second resistors; and a first switch that is coupled in parallel to the first resistor.

12. The apparatus of claim 11, wherein the first impedance network further comprises:

a third resistor that is coupled to the first mixer;

a fourth resistor that is coupled in series with the third resistor, wherein a collective impedance of the third and fourth resistors is approximately equal to the feedback impedance, and wherein the second mixer is coupled to a node between the first and second resistors; and a second switch that is coupled in parallel to the first resistor.

13. The apparatus of claim 10, wherein the first impedance network further comprises a first resistor having the feedback impedance and wherein the second impedance network further comprises a second resistor having the feedback impedance.

14. The apparatus of claim 13, wherein the mixing circuit further comprises a dummy path that is coupled to second capacitor.

15. The apparatus of claim 13, wherein the differential amplifier further comprises a first differential amplifier, and wherein the dummy path further comprises:

a third mixer that is coupled to the second capacitor; and a second differential amplifier that is coupled to the third mixer.

16. The apparatus of claim 15, wherein the fraction further comprises a first fraction, and wherein the mixing signal further comprises a first mixing signal, and wherein the third mixer mixes the second amplified signal with a second mixing signal having a duty cycle that is a second fraction of the local oscillator duty cycle.

17. The apparatus of claim 15, wherein the transistors from each of first and second mixers have a first size, and wherein the transistors from the third mixer have a second size of K−1 times of the first size.

* * * * *